(12) United States Patent
Tachibana et al.

(10) Patent No.: US 6,473,333 B1
(45) Date of Patent: Oct. 29, 2002

(54) STORAGE CIRCUIT WITH LAYERED STRUCTURE ELEMENT

(75) Inventors: Suguru Tachibana, Akiruno (JP); Katsuro Sasaki, Kunitachi (JP); Kiyoo Itoh, Higashikurume (JP); Tomoyuki Ishii, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/986,946

(22) Filed: Nov. 13, 2001

Related U.S. Application Data

(63) Continuation of application No. PCT/JP99/02505, filed on May 14, 1999.

(51) Int. Cl.⁷ .............................................. G11C 11/40
(52) U.S. Cl. ...................... 365/154; 365/156; 257/903
(58) Field of Search ................................ 365/154, 156; 257/903, 904

(56) References Cited

U.S. PATENT DOCUMENTS 5,732,015 A * 3/1998 Kazerounian et al. ...... 365/154
5,892,712 A * 4/1999 Hirose et al. ............... 365/154

FOREIGN PATENT DOCUMENTS

JP          10-20001          11/1997

OTHER PUBLICATIONS

"PLED—Planar Localised Electron Devices," Kazuo Nakazato, Pawel J.A. Piotrowicz, David G. Hasko, Haroon Ahmed and Kiyoo Itoh, 1997 IEEE, IEDM Technical Digest 97, pp/ 179–182 (1997).

"Normally–off PLED (Planar Localised Electron Device) for non–volatile memory," Hiroshi Mizuta, Kazuo Nakazato, Pawel J.A. Piotrowicz, Kiyoo Itoh, Tatsuya Teshima, Ken Yamaguchi and Toshikazu Shimada, Symposium on VLSI Technology, Technical Digest 1998 IEEE, pp. 1–2.

* cited by examiner

*Primary Examiner*—Son Mai

(57) ABSTRACT

The present invention provides a circuit, in which a device typified by a PLED element is built into a flip-flop. In this case, a storage node of the device is low leakage. According to the present invention, it is possible to realize a SRAM that has nonvolatility while achieving high-speed operation. It is also possible to realize a flip-flop having the same characteristics. An example of a typical mode of the present invention is a storage circuit characterized by the following: a storage element is a device incorporating: a first path for a carrier; a first mode for storing a charge that generates an electric field where conductivity of the first path is changed; and a barrier structure through which a second carrier moves in response to given voltage so that the second carrier is stored in the first node; and the storage circuit includes a second node, to which information stored in the first node is outputted steadily in a state in which power is supplied. The flip-flop and the SRAM are realized using such a basic circuit.

13 Claims, 10 Drawing Sheets

STORAGE CIRCUIT WITH LAYERED STRUCTURE ELEMENT

This application is a continuation of PCT/JP99/02505 filed May 14, 1999.

TECHNICAL FIELD

The present invention relates to a storage circuit and a semiconductor memory device.

BACKGROUND ART

At present, as typical large-capacity semiconductor memory devices, a DRAM (Dynamic Random Access Memory) and a flash memory are named. In future, when pursuing further minuteness, and when trying to achieve reduction of bit cost and high performance, there are problems to be solved in each of these aspects. As regards further minuteness of the DRAM, a problem exists in measures for the structure of a capacity section, which results from the fact that the current DRAM adopts a cell structure of one transistor—one capacitor. To be more specific, the problem relates to the measures for the so-called stacked structure, in which for example, a capacity section is laminated on a substrate.

At present, the flash memory also has a problem of compatibility between minuteness and a life of a data storage period. Under the present circumstances, the flash memory is being developed with both of them as a backdrop. More specifically, the flash memory has the following principles of operation: during a write period, Fowler-Nordheim (FN)electric current is fed by means of a tunnel effect, or electric current is fed through an oxide film by a hot electron. Therefore, the electric current degrades the oxide flim, which places a limit on the number of times writing is allowed. In addition, it is not possible to scale the thickness of the oxide film in order to hold data. For these reasons, as described above, there is the problem of compatibility between minuteness and the life of a data storage period. Moreover, because the flash memory uses the same oxide film both for writing data and for data storage, the flash memory has also the disadvatage of compatibility between writing speed and a period during which data is held. Therefore, if the flash memory is used as a non-volatile memory, writing speed acnnot be increased under the present circumstances.

As a memory structure for solving the problems of the current large-capacity semiconductor memory, a PLED (Planar Localised Electron Device) is proposed. This can be found in, for example, reports at a symposium about VLSI technology in 1998, or the Japanese publication of patent applications (Japanese Patent Application Laid-Open No. Hei 10-200001, etc.). To be more specific, the examples at the symposium are the following: K. Nakazato et al., "PLED-Planar Localised Electron Devices", IEDM Tech. Dig., pp. 179–182, 1997; H. Mizuta et al., "Normally-off PLED (planar Localised Electron Device) for non-volatile memory," Symposium on VLSI Technology Tech. Dig. 1998.

In the documents named above, a PLED element is integrated as a layered structure on a transistor, which is produced on a silicon substrate. Using this as a gain cell solves the problem of complication of DRAM cell capacity. In addition, the documents also describe the following: as a layered structure, separating a storage node from a pn junction enables dramatic reduction of leak electric current at the junction; because of it, application as a non-volatile memory such as the flash memory becomes possible.

As above, the large-capacity semiconductor memory was described. In the field where high speed is required, a SRAM, in which six transistors constitute a cell, is generally used. A requirement for a non-volatile memory used for mobile apparatuses is high. However, as regards the conventional SRAM cell, in order to use the SRAM cell as a non-volatile memory, a combination of the SRAM cell with a battery backup is forced, which requires power consumption caused by leak electric current of a memory and a peripheral circuit.

DISCLOSURE OF INVENTION

An object of the present invention is to solve the problems of the prior art, and to provide a storage circuit or a flip-flop circuit, which has low power consumption, is non-volatile, and is high-speed. The present invention provides a SRAM cell that is low power consumption, non-volatile, and high-speed.

According to the present invention, it is possible to provide a low power consumption SRAM cell or a low power consumption flip-flop circuit, which is not provided by the prior art.

Moreover, another object of the present invention is to provide a non-volatile flip-flop that uses a low leak device as typified by the PLED element. Thus, in a state in which the power is supplied, having a node, which outputs stored information steadily, enables some circuit setting, and enables application as a Content Addressable Memory, etc.

A basic configuration according to the present invention is a storage circuit characterized by the following: said storage circuit has a semiconductor storage element, of which a memory node becomes low leakage, in a memory area; and said storage circuit has a second node, to which information stored in the first node is outputted steadily in a state in which power is supplied. In this case, the semiconductor storage element, of which a memory node is low leakage, means that a semiconductor storage element in which an interval of a holding operation of required storage information is long. If the interval of the holding operation of required storage information is, for example, one second or more (preferably, 10 seconds or more), it is suitable as the low leak semiconductor storage element according to the present invention. Moreover, if the interval of the holding operation of required storage information is about once a day or more, or about once a week or more, it is needless to say that the element is more desirable.

One specific configuration example of the present invention is a storage circuit characterized by the following:
a storage element is a device comprising:
  a first path for a carrier;
    a first node for storing a charge that generates an electric field where conductivity of the first path is changed; and
    a barrier structure through which a second carrier moves in response to a given voltage so that the second carrier is stored in the first node; and
  said storage circuit comprises a second node, to which information stored in the first node is output steadily in
    a state in which power is supplied.
According to the storage circuit, it is possible to provide a non-volatile flip-flop circuit, which is capable of holding stored information even when the power supply is turned off. Moreover, according to the storage circuit, it is possible to provide a non-volatile SRAM (Static Random Access Memory), which is capable of holding stored information even when the power supply is turned off.

For purposes of providing the SRAM, it is desirable to configure a circuit according to the invention concepts, which will be described below. To be more specified, in the example, the low leak semiconductor element is built into a flip-flop; and a switch of the low leak semiconductor storage element is provided between a gate electrode of a drive transistor of the flip-flop and an output in phase with the gate electrode. Then, while writing and while data is being stored, the switch is turned ON or OFF. Thus, while writing data, an operation similar to that of the general SRAM is performed. In addition to it, while data is being stored, nonvolatility can also be achieve by shutting down the power supply.

A typical example of the semiconductor element for a switch, in which electric current is low leakage, is commonly called a PLED element. This PLED element is a semiconductor element comprising a layered structure of an insulated layer and a semiconductor layer, said semiconductor element is characterized by the following: the layered structure is placed between a first electrode and an electron storage node; and the layered structure controls electric current. As described above, this element itself can be found in, for example, the Japanese publication of patent applications (Japanese Patent Application Laid-Open No. Hei 10-200001).

In this case, in comparison with the present invention, the prior art will be considered as below. In general, the flip-flop circuit has a node that outputs stored information steadily in a state in which the power is supplied. Therefore, for example, using the value of the stored information enables some circuit setting, and enables use as a Content Addressable Memory. However, because a DRAM cell cannot output the stored information steadily, its application is limited. In addition, as regards a backup SRAM circuit that uses a conventional battery, power is always supplied to a memory circuit. Therefore, power consumption due to leak electric current of a memory cell and a peripheral circuit cannot be avoided. The present invention can eliminate these limits. In this connection, in the document, the Japanese publication of patent applications, and the like, which were described above, application of the PLED element as a large-capacity semiconductor memory is mentioned. However, application as a high-speed memory or a flip-flop is not included.

Next, main modes of the present invention will be listed as below. The modes will be described more specifically in "Best Modes for Carrying out the Invention".

(1) A first mode relates to a storage circuit comprising a flip-flop, wherein:
  a storage element is a device comprising:
    A first path for a carrier;
    A first node for storing a charge that generates an electric field where conductivity of the first path is changed; and
    a barrier structure through which a second carrier moves in response to given voltage so that the second carrier is stored in the first node; and
  said flip-flop has at least a second node, to which information stored in the first node is output steadily in a state in which power is supplied to the storage element.

(2) A second mode relates to a storage circuit comprising a flip-flop, wherein:
  a first cross couple, which uses two N type gate insulated field effect transistors, and a second cross couple, which uses two P type gate insulated field effect transistors, are connected in parallel;
  between a gate electrode of a drive gate insulated field effect transistor for either of the first cross couple or the second cross couple and a node for outputting a voltage in phase with the gate electrode, there is a layered structure of an insulated layer and a semiconductor layer;
  the layered structure is placed between a first electrode and an electron storage node; and
  said flip-flop has at least a second node, to which information stored in the first node is outputted steadily in a state in which power is supplied to the storage element.

(3) A third mode relates to a storage circuit comprising a flip-flop, wherein:
  a first cross couple, which uses two N type gate insulated field effect transistors, and a second cross couple, which uses two P type gate insulated field effect transistors, are connected in parallel;
  between a gate electrode of a drive gate insulated field effect transistor of the first cross couple, which uses the N type gate insulated field effect transistor, and a node for outputting a voltage in phase with the gate electrode, there is a layered structure of an insulated layer and a semiconductor layer;
  the layered structure is placed between a first electrode and an electron storage node; and
  said flip-flop has a semiconductor element, in which the layered structure controls electric current.

(4) A fourth mode relates to a storage circuit comprising a flip-flop, wherein:
  a first cross couple, which uses two N type gate insulated field effect transistors, and a second cross couple, which uses two P type gate insulated field effect transistors, are connected in parallel;
  said flip-flop has a semiconductor storage element, in which stored information is low leakage, between a gate electrode of a drive gate insulated field effect transistor of the first cross couple, which uses the N type gate
insulated field effect transistor, and a node for outputting a voltage in phase with the gate electrode.

(5) A fifth mode relates to a storage circuit comprising a flip-flop, wherein:
  a first cross couple, which uses two N type gate insulated field effect transistors, and a second cross couple, which uses two P type gate insulated field effect transistors, are connected in parallel; and
  said flip-flop has a device between a gate electrode of a drive gate insulated field effect transistor for either of the first cross couple or the second cross couple and a node for outputting a voltage in phase with the gate electrode, said device comprising:
    a first path for a carrier;
    a first node for storing a charge that generates an electric field where conductivity of the first path is changed; and
    a barrier structure through which a second carrier moves in response to given voltage so that the second carrier is stored in the first node.

(6) A sixth mode relates to a storage circuit comprising a flip-flop, wherein:
  a first cross couple, which uses two N type gate insulated field effect transistors, and a second cross couple, which uses two P type gate insulated field effect transistors, are connected in parallel; and said flip-flop has a device between a gate electrode of a drive gate insulated field effect transistor of the first cross couple, which uses the N type gate insulated field effect transistor, and a node for outputting a voltage in phase with the gate electrode, said device comprising:
- a first path for a carrier;
- a first node for storing a charge that generates an electric field where conductivity of the first path is changed; and
- a barrier structure through which a second carrier moves in response to given voltage so that the second carrier is stored in the first node.

(7) A seventh mode relates to a storage circuit comprising a flip-flop, wherein:
- a first cross couple, which uses two N type gate insulated field effect transistors, and a second cross couple, which uses two P type gate insulated field effect transistors, are connected in parallel so that a first impurity area of the N type gate insulated field effect transistor is connected to a second impurity area of the P type gate insulated field effect transistor, and so that a gate electrode of the N type gate insulated field effect transistor is connected to a gate electrode of the P type gate insulated field effect transistor; and
- said storage flip-flop has a device between a gate electrode of a drive gate insulated field effect transistor for the first and the second cross couple and a node for outputting a voltage in phase with the gate electrode, said device comprising:
  - a first path for a carrier;
  - a first node for storing a charge that generates an electric field where conductivity of the first path is changed; and
  - a barrier structure through which a second carrier moves in response to given voltage so that the second carrier is stored in the first node.

(8) An eighth mode relates to a storage circuit comprising a flip-flop, wherein:
- a first cross couple, which uses two N type gate insulated field effect transistors, and a second cross couple, which uses two P type gate insulated field effect transistors, are connected in parallel so that a first impurity area of the N type gate insulated field effect transistor is connected to a second impurity area of the P type gate insulated field effect transistor, and so that a gate electrode of the N type gate insulated field effect transistor is connected to a gate electrode of the P type gate insulated field effect transistor; and
- said flip-flop has a semiconductor storage element, in which stored information is low leakage, between a gate electrode of a drive gate insulated field effect transistor for the first and the second cross couple and a node for outputting a voltage in phase with the gate electrode.

(9) A ninth mode relates to a storage circuit comprising a flip-flop, wherein:
- a first cross couple, which uses two N type gate insulated field effect transistors, and a second cross couple, which uses two P type gate insulated field effect transistors, are connected in parallel so that a first impurity area of the N type gate insulated field effect transistor is connected to a second impurity area of the P type gate insulated field effect transistor, and so that a gate electrode of the N type gate insulated field effect transistor is connected to a gate electrode of the P type gate insulated field effect transistor; and
- between a gate electrode of a drive gate insulated field effect transistor for the first and the second cross couple and a node for outputting a voltage in phase with the gate electrode, there is a layered structure of an insulated layer and a semiconductor layer;
- the layered structure is placed between a first electrode and an electron storage node; and
- said flip-flop has a semiconductor element, in which the layered structure controls electric current.

(10) A tenth mode relates to a storage circuit comprising a flip-flop, wherein:
- a first cross couple, which uses two N type gate insulated field effect transistors, and a second cross couple, which uses two P type gate insulated field effect transistors, are connected in parallel so that a first impurity area of the N type gate insulated field effect transistor is connected to a second impurity area of the P type gate insulated field effect transistor, and so that a gate electrode of the N type gate insulated field effect transistor is connected to a gate electrode of the P type gate insulated field effect transistor; and
- said flip-flop has a semiconductor storage element, in which stored information is low leakage, between a gate electrode of a drive gate insulated field effect transistor for the first and the second cross couple and a node for outputting a voltage in phase with the gate electrode.

(11) An eleventh mode relates to a storage circuit comprising a flip-flop, wherein:
- a first cross couple, which uses two N type gate insulated field effect transistors, and a second cross couple, which uses two P type gate insulated field effect transistors, are connected in parallel; and
- between a gate electrode of a drive gate insulated field effect transistor for either of the first cross couple or the second cross couple and a node for outputting a voltage in phase with the gate electrode, there is a layered structure of an insulated layer and a semiconductor layer;
- the layered structure is placed between a first electrode and an electron storage node; and
- said flip-flop has a semiconductor element, in which the layered structure controls electric current.

(12) A twelfth mode relates to a Static Random Access Memory device having a memory cell that comprises a flip-flop, wherein:
- a first cross couple, which uses two N type gate insulated field effect transistors, and a second cross couple, which uses two P type gate insulated field effect transistors, are connected in parallel; and
- between a gate electrode of a drive gate insulated field effect transistor of the first cross couple, which uses the N type gate insulated field effect transistor, and a node for outputting a voltage in phase with the gate electrode, there is a layered structure of an insulated layer and a semiconductor layer;
- the layered structure is placed between a first electrode and an electron storage node; and
- said flip-flop has a semiconductor element, in which the layered structure controls electric current.

(13) A thirteenth mode relates to a Static Random Access Memory device having a memory cell that comprises a flip-flop, wherein:
- a first cross couple, which uses two N type gate insulated field effect transistors, and a second cross couple, which uses two P type gate insulated field effect transistors, are connected in parallel; and said flip-flop has a semiconductor storage element, in which stored information is low leak, between a gate electrode of a drive gate insulated field effect transistor of the first cross couple, which uses the N type gate insulated field effect transistor, and a node for outputting a voltage in phase with the gate electrode.

(14) A fourteenth mode relates to a Static Random Access Memory device having a memory cell that comprises a flip-flop, wherein:

a first cross couple, which uses two N type gate insulated field effect transistors, and a second cross couple, which uses two P type gate insulated field effect transistors, are connected in parallel; and said flip-flop has a device between a gate electrode of a drive gate insulated field effect transistor for either of the first cross couple or the second cross couple and a node for outputting a voltage in phase with the gate electrode, said device comprising:
a first path for a carrier;
a first node for storing a charge that generates an electric field where conductivity of the first path is changed; and
a barrier structure through which a second carrier moves in response to given voltage so that the second carrier is stored in the first node.

(15) A fifteenth mode relates to a Static Random Access Memory device having a memory cell that comprises a flip-flop, wherein:

a first cross couple, which uses two N type gate insulated field effect transistors, and a second cross couple, which uses two P type gate insulated field effect transistors, are connected in parallel; and said flip-flop has a device between a gate electrode of a drive gate insulated field effect transistor of the first cross couple, which uses the N type gate insulated field effect transistor, and a node for outputting a voltage in phase with the gate electrode, said device comprising:
a first path for a carrier;
a first node for storing a charge that generates an electric field where conductivity of the first path is changed; and
a barrier structure through which a second carrier moves in response to given voltage so that the second carrier is stored in the first node.

(16) A sixteenth mode relates to a Static Random Access Memory device having a memory cell that comprises a flip-flop, wherein:

a first cross couple, which uses two N type gate insulated field effect transistors, and a second cross couple, which uses two P type gate insulated field effect transistors, are connected in parallel so that a first impurity area of the N type gate insulated field effect transistor is connected to a second impurity area of the P type gate insulated field effect transistor, and so that a gate electrode of the N type gate insulated field effect transistor is connected to a gate electrode of the P type gate insulated field effect transistor; and said storage flip-flop has a device between a gate electrode of a drive gate insulated field effect transistor for the first and the second cross couple and a node for outputting a voltage in phase with the gate electrode, said device comprising:
a first path for a carrier;
a first node for storing a charge that generates an electric field where conductivity of the first path is changed; and
a barrier structure through which a second carrier moves in response to given voltage so that the second carrier is stored in the first node.

(17) A seventeenth mode relates to a Static Random Access Memory device having a memory cell that comprises a flip-flop, wherein:

a first cross couple, which uses two N type gate insulated field effect transistors, and a second cross couple, which uses two P type gate insulated field effect transistors, are connected in parallel so that a first impurity area of the N type gate insulated field effect transistor is connected to a second impurity area of the P type gate insulated field effect transistor, and so that a gate electrode of the N type gate insulated field effect transistor is connected to a gate electrode of the P type gate insulated field effect transistor; and said flip-flop has a semiconductor storage element, in which stored information is low leakage, between a gate electrode of a drive gate insulated field effect transistor for the first and the second cross couple and a node for outputting a voltage in phase with the gate electrode.

(18) An eighteenth mode relates to a Static Random Access Memory device having a memory cell that comprises a flip-flop, wherein:

a first cross couple, which uses two N type gate insulated field effect transistors, and a second cross couple, which uses two P type gate insulated field effect transistors, are connected in parallel so that a first impurity area of the N type gate insulated field effect transistor is connected to a second impurity area of the P type gate insulated field effect transistor, and so that a gate electrode of the N type gate insulated field effect transistor is connected to a gate electrode of the P type gate insulated field effect transistor; and said storage flip-flop has a device between a gate electrode of a drive gate insulated field effect transistor for the first and the second cross couple and a node for outputting a voltage in phase with the gate electrode, said device comprising:
a first path for a carrier;
a first node for storing a charge that generates an electric field where conductivity of the first path is changed; and
a barrier structure through which a second carrier moves in response to given voltage so that the second carrier is stored in the first node.

(19) A nineteenth mode relates to a Static Random Access Memory device having a memory cell that comprises a flip-flop, wherein:

a first cross couple, which uses two N type gate insulated field effect transistors, and a second cross couple, which uses two P type gate insulated field effect transistors, are connected in parallel so that a first impurity area of the N type gate insulated field effect transistor is connected to a second impurity area of the P type gate insulated field effect transistor, and so that a gate electrode of the N type gate insulated field effect transistor is connected to a gate electrode of the P type gate insulated field effect transistor; and said flip-flop has a semiconductor storage element, in which stored information is low leakage, between a gate electrode of a drive gate insulated field effect transistor for the first and the second cross couple and a node for outputting a voltage in phase with the gate electrode.

BEST MODES FOR CARRYING OUT THE INVENTION

Before describing modes for carrying out the invention, general means according to the present invention will be listed and described as below.

Figure 1:
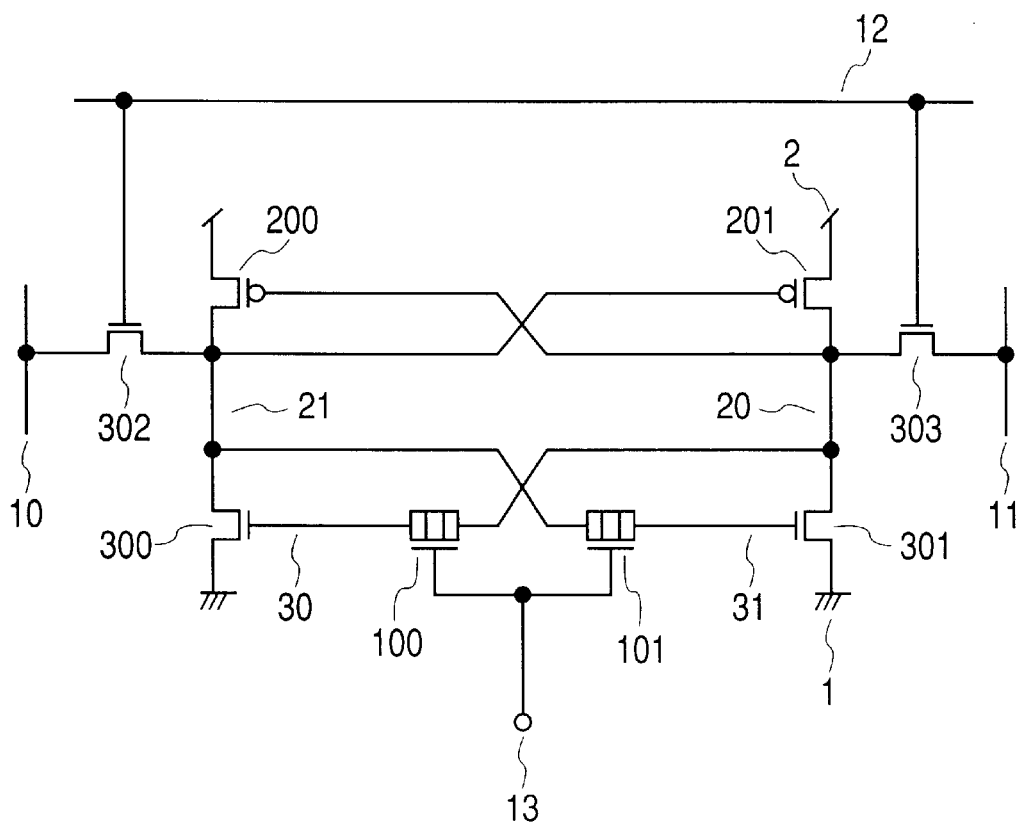
FIG. 1 is a circuit diagram illustrating a flip-flop circuit according to the present invention.
Figure 2:
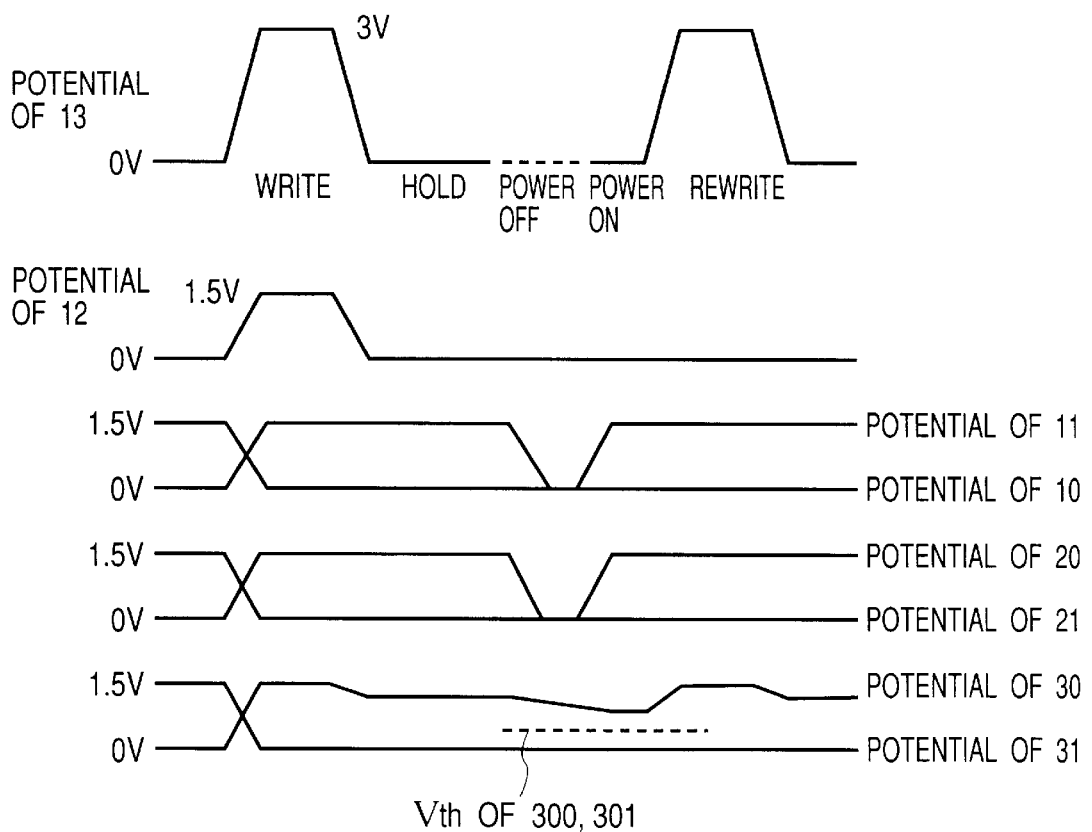
FIG. 2 is a time chart illustrating a part of an operation waveform of a circuit shown in FIG. 1.
Figure 3:
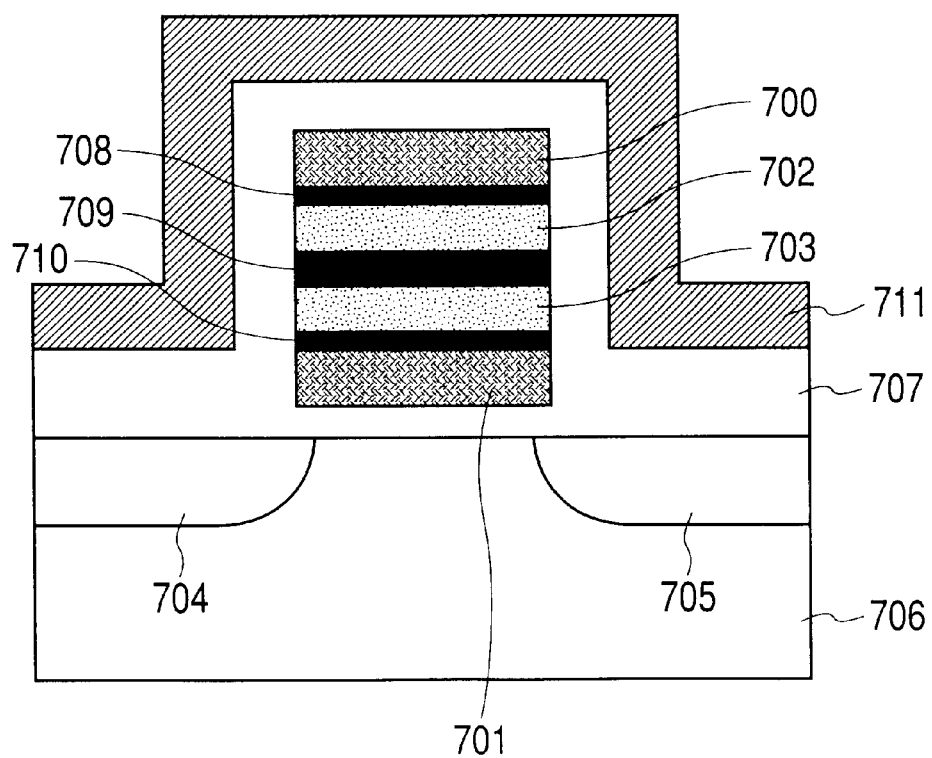
FIG. 3 is a cross section of a semiconductor element used for the circuit shown in FIG. 1.

The present invention will be described with reference to FIGS. 1 and 2. FIG. 1 is a circuit diagram illustrating a flip-flop circuit according to the present invention. FIG. 2 is a time chart illustrating a waveform of operation when this circuit is used. FIG. 3 illustrates an example of memory device structure, which is used for the circuit.

An example of FIG. 1 shows a memory cell that uses a so-called flip-flop. In the so-called SRAM, a plurality of such memory cells is placed. In general, the plurality of memory cells is placed in a matrix form using data lines and word lines.

In FIG. 1, a reference numeral 1 is a negative power supply terminal (usually, GND); a reference numeral 2 is a positive power supply terminal (Vcc); reference numerals 10 and 11 are a write data line and a read data line respectively; a reference numeral 12 is a write word line or a read word line; and a reference numeral 13 is a write word line or a refresh word line. The flip-flop circuit as shown in FIG. 1 is configured using the following: the PLED elements 100, 101; P type gate insulated field effect transistors (hereinafter they are abbreviated as PMOS) 200, 201; and N type gate insulated field effect transistors (hereinafter they are abbreviated as NMOS) 300, 301. It is to be noted that, instead of the PLED element, a different semiconductor element for switching low leak electric current can be used. Reference numerals 302 and 303 are NMOSS, each of which constitute a transfer gate section. The circuit performs general operation of the flip-flop circuit. Reference numerals 20, 21 show output signals of the flip-flop circuit; and reference numerals 30, 31 show storage nodes of the flip-flop circuit according to the present invention.

Characteristics of the circuit from the viewpoint of configuration and operation will be listed as below.

(1) Switch elements of low leak devices (100, 101 in FIG. 1) are provided at the following positions respectively: between the gate electrode (30 in FIG. 1) of the drive transistor (300 in FIG. 1) of the flip-flop and an output (20 in FIG. 1) in phase with the gate electrode; and between the gate electrode (31 in FIG. 1) of the drive transistor (301 in FIG. 1) of the flip-flop and an output (21 in FIG. 1) in phase with the gate electrode.

(2) Operation while writing data will be described as below. To be more specific, when a voltage is applied, concurrently with the gate (12 in FIG. 1) of the transfer gates for writing the flip-flop (302, 303 in FIG. 1), the gate (13 in FIG. 1) of the low leak switch devices (100, 101 in FIG. 1) becomes a high level, which writes data of the write data lines (10, 11 in FIG. 1) in the flip-flop.

FIG. 2 shows a state of potential at each node while writing data, while data is being stored, when the power supply shuts down, while rewriting data, and the like. This will help understand operation of writing to the flip-flop.

(3) Operation of a state of data storage will be described as below. That is to say, the gate (13 in FIG. 1) of the low leak switch devices (100, 101 in FIG. 1) is a low level. FIG. 2 shows a state while data is being stored.

(4) A semiconductor element for a switch according to the present invention is a low leak switch device. Therefore, leak electric current, which remains in the low leak switch devices (100, 101 in FIG. 1) of this storage node slightly, causes electric charge of the storage nodes (30, 31 in FIG. 1) to decrease gradually.

In the present invention, in order to compensate the leak electric current, after a period determined by the leak electric current, while keeping potential of the gate (12 in FIG. 1) of the transfer gates for writing the flip-flop (302, 303 in FIG. 1) at a low level, the gate (13 in FIG. 1) of the low leak switch devices (100, 101 in FIG. 1) is increased to a high level to rewrite data.

The operation of rewriting data is exemplified in FIG. 2.

(5) In order to avoid decrease in high level potential of the storage nodes (30, 31 in FIG. 1), which is caused by a threshold voltage of the low leak switch devices (100, 101 in FIG. 1), it is desirable that the high potential level of the gate (13 in FIG. 1) of the low leak switch devices (100, 101 in FIG. 1) is increased to a level that is higher than a high level of the flip-flop by about the threshold voltage of the low leak switch devices (100, 101 in FIG. 1). Refer to FIG. 2.

In this connection, more detailed operation of the circuit will be described later.

In this manner, it is possible to provide a storage circuit characterized by the following: a memory mode has a low leak semiconductor element for switching in a memory area; and said storage circuit has a second node, to which information accumulated in the first node is outputted steadily in a state in which power is supplied.

In addition, according to the present invention, nonvolatility can also be achieved by the following: while writing data, performing an operation similar to that of the general SRAM; and while data is being stored, shutting down the power supply. More specifically, the main points of the operation are the following: the low leak semiconductor element is built into a flip-flop; a switch of a semiconductor storage element, of which leak electric current is low, is provided between a gate electrode of a drive transistor of the flip-flop and an output in phase with the gate electrode; and while writing data, and while data is being stored, the switch is turned ON or OFF.

Figure 4:
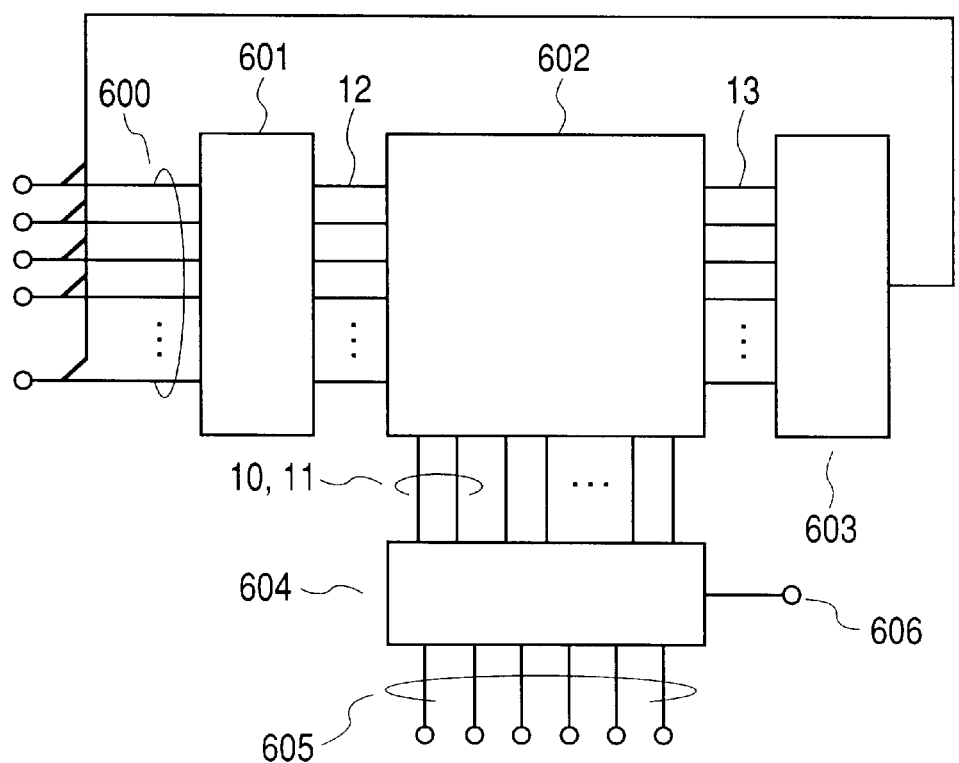
FIG. 4 is a diagram illustrating a configuration example of a SRAM that uses the present invention.

FIG. 4 shows a basic configuration of a semiconductor storage device that uses a SRAM cell. In this configuration, the memory cell is placed as a memory cell array section of the SRAM.

In FIG. 4, a reference numeral 600 indicates a row address; a reference numeral 605 indicates a column address; a reference numeral 602 is a memory cell array section; a reference numeral 601 is a row decoder for selecting the word line 12 of the memory cell array 602; and a reference numeral 603 is a row decoder for selecting the refresh word line 13. In addition, a reference numeral 604 indicates a column decoder for selecting data lines 10, 11 and a sense amplifier section. A reference numeral 606 is its output.

The SRAM circuit, which has been configured in this manner, can be operated as a general SRAM circuit except that the word lines 12 and 13 are selected simultaneously while writing data.

Moreover, in the SRAM circuit, as described in FIG. 1, when shutting down the power supply, holding potential of the word line 13 at 0 V avoids an electric charge, which has been accumulated in the nodes 30, 31 shown in FIG. 1, from being lost. Therefore, even when the power supply is shut down, data can be held. As a result, when power is turned on again, data can be read.

As described above, according to the present invention, it is possible to realize a SRAM that has nonvolatility while achieving high-speed operation.

Next, the modes of the present invention will be described in detail using the flip-flop circuit as an example. Operation of the circuit shown in FIG. 1 and a time chart shown in FIG. 2 will be taken into consideration.

In the first place, writing of data will be described. Reference numerals 100, 101 shown in FIG. 1 indicate switch elements, of which leak electric current is low. FIG. 1 shows a case in which a n type PLED element is used. A threshold voltage of the PLED element is 1.5 V.

To begin with, data, which should be written to the flip-flop, is given to the write data lines 10, 11. In FIG. 2, the example is illustrated on the assumption that potential of the reference numeral 11 is a high level (hereinafter it is abbreviated as "H"), and that potential of the reference numeral 10 is a low level (hereinafter it is abbreviated as "L"). Driving the gate 12 of the transfer gates for writing 302, 303 of the flip-flop "H" causes the output 21 to become "L" (0 V). In this connection, FIG. 2 shows a case where a power supply voltage is 1.5 V, and potential "H" of the reference numeral 12 is 1.5 V.

When the output 21 becomes "L", the PMOS 201 enters into a continuity state (hereinafter it is abbreviated as ON), which drives the output 20 "H". Holding potential of the gate 13 of the PLED elements 100, 101 "H" concurrently with holding potential of the gate 12 of the transfer gates 302, 303 "H" causes potential of gates 30, 31 of the NMOSs 300, 301 to become "H" and "L" respectively. In this case, increasing the potential "H" of the gate 13 of the PLED elements 100, 101 to a value (3 V), which is higher than the power supply voltage of the flip-flop (1.5 V) by a threshold voltage (1.5 V) of the PLED element, permits "H" of the storage nodes 30, 31 to be equivalent to the power supply voltage (1.5 V).

The following operation is performed to enter a state, in which data is being held, after the data has been written. Potential of the gate electrode 13 of the PLED elements 100, 101 are held "L". As a result, a state of the electric charge of the storage nodes 30, 31 is stored. Because potential of the nodes 30, 31 are "H" and "L" respectively, the reference numeral 300 becomes ON, and the reference numeral 21 becomes "L". The PMOS 201 also holds a state of ON. Therefore, potential of the output nodes 20, 21 also holds a state of "H" and a state of "L" respectively. When changing the potential of the gate electrode 13 of the PLED elements 100, 101 from "H" to "L", potential of the storage nodes 30, 31 decreases to some degree due to coupling capacity of the word line 13 and the storage nodes 30, 31. Therefore, it is desirable to use a cell structure, in which there is as small a coupling capacity of the word line 13 and the storage nodes 30, 31 as possible.

As is the case with the conventional SRAM cell, for the purpose of reading data, it is possible to read the data by the data lines 10, 11 while holding potential of the gate 12 of the transfer gates 302, 303 "H". In this case, reading speed equivalent to that of the conventional SRAM cell can be obtained. This is clear from the fact that a transistor related to reading is the same as the conventional SRAM cell. Moreover, stored data is always output to the outputs 20, 21. Therefore, if it is not necessary to select an address using the word line 12, outputs 20, 21 can be used directly.

Next, operation of a non-volatile memory, which holds data even when the power supply is shut down, will be described.

If the power supply is shut down while holding potential of the gate 13 of the PLED elements 100, 101 "L" (0 V in this example), electric charge of the storage nodes 30, 31 will be held because the electric charge has no path for electric discharge. If there is no leak electric current in the PLED elements 100, 101 at all, potential "H" of the storage node 30, which has been stored, will not be lost. However, it is thought that, in actuality, leak electric current flows to some degree even in this semiconductor element. Due to the leak electric current of the PLED element 100, the potential of the node 30 decreases gradually. Before the potential of the node 30 decreases due to the leak electric current, which results in a failure in recognizing the potential as "H", the power is turned on to perform rewriting while holding potential of the gate 13 of the PLED elements 100, 101 "L" (0 V in this example)

If the power is turned on while holding the potential of the gate 13 of the PLED elements 100, 101 "L" (0 V in this example), the electric charge of the storage nodes 30, 31 will not be discharged. Therefore, as is the case with the writing of data, the following state is reproduced: NMOS 300 and PMOS 201 are ON; NMOS 301 and PMOS 200 are not conducting (hereinafter it is abbreviated as OFF). In addition, also for potential of the output nodes 20, 21, states of "H" and "L" are reproduced respectively.

In this case, forcing only potential of the gate 13 of the PLED elements 100, 101 "H" permits potential of the gates 30, 31 of the NMOSs 300, 301 to return to 1.5 V, 0 V respectively. If the period after which rewriting is required is, for example, about once a day, turning the power on once a day for rewriting enables us to use the elements as non-volatile memory. In this manner, according to the present invention, because it is not always required to provide power supply voltage, leak electric current of peripheral circuits, etc. can be reduced largely and effectively. In addition, as opposed to the flash memory, there is no limit on the number of times writing is allowed. Therefore, a non-volatile memory, of which the number of times of writing is equivalent to that of the SRAM, can be realized.

As described above, using the circuit configuration exemplified in FIG. 1 enables us to realize a SRAM cell or a flip-flop, which is low power consumption, non-volatile, and high-speed. Moreover, it is possible to realize a non-volatile flip-flop that uses a device in which a memory node is low leakage, and which is typified by the PLED element. In addition, it is possible to provide the nodes 20, 21 that output stored information steadily in a state in which the power is supplied. This allows some circuit setting and application as Content Addressable Memory, etc.

FIG. 3 shows an example of device structure of the PLED elements 100, 101 that have been used up to this time. By the way, in FIG. 3, in order to make understanding of an outline of this semiconductor storage element easy, the semiconductor substrate 706 and a laminated area, which is laminated on the semiconductor substrate 706, are illustrated so that their directions intersect. To be more specific, generally speaking, in an actual configuration, a direction of a line connecting an impurity area 704 with an impurity area 705 intersects a direction to which the word line 13 extends.

This PLED element is a typical semiconductor device suitable for the present invention, of which stored information becomes low leakage, to be more specific, charge accumulated in a storage node becomes low leakage. Additionally, the PLED element can be said to be a semiconductor element characterized by the following: said semiconductor element has a layered structure of an insulated layer and a semiconductor layer; the layered structure is placed between an electrode structure and an electron storage node; and barrier height control of the layered structure controls electric current flowing between the electrode structure and the electron storage node. Because the semiconductor element itself is described in the document and the publication of patent applications, the details will be omitted. However, it is considered that electric current is controlled by the barrier height control for a carrier by the layered structure. To be more specific, it is considered that the control of electric current can be switched between an operation mode of a high barrier height and an operation mode of a low barrier height as compared with this.

Next, main points of the structure will be described as below.

The n+ type impurity areas 704, 705 are formed on the p type semiconductor substrate 706 as is the case with the general insulated-gate field-effect transistor. The gate insulated field effect transistor, which has been formed in this manner, corresponds to the transistor 300 or 301 shown in FIG. 1. Therefore, it is shown that the element configuration in FIG. 3 is formed as a layered structure in which the transistor 300 or 301 and a new element section 100 or 101 in the circuit in FIG. 1 are put together.

A new semiconductor element section is placed through a gate insulated layer 707 of the gate insulated field effect transistor and a gate electrode 701 of the gate insulated field effect transistor. This new element section is equivalent to the reference numeral 100 or 101 shown in FIG. 1.

A typical example of the insulated layer 707 is a silicon dioxide film. An example of this upper layered structure will be described as below. To begin with, n+ type poly-silicon layer 701 is placed. After that, a multilayer film, which becomes a barrier structure for a carrier, is placed. More specifically, this multilayer film is a n+ type poly-silicon layer 700, in which an insulated layer 710, an intrinsic poly-silicon layer 703, an insulated layer 709, an intrinsic poly-silicon layer 702, an insulated layer 708, and a source or a drain of the PLED element are placed one after another. An insulated layer is often a silicon dioxide film. Or, an insulated layer, which is formed in a multilayer manner as this insulated layer, can be used. On its upper portion, a conductive layer 711, which will become a word line, is formed.

The n+ type poly-silicon layer 701 shown in FIG. 3 becomes a gate electrode in a bulk crystal. Therefore, this n+ type poly-silicon layer 701 becomes the storage node 30 or 31 shown in FIG. 1. Areas of reference numerals 704, 701, 705 shown in FIG. 3 correspond to an impurity area and a channel area, which become a source and a drain of a transistor. This corresponds to the transistor 300, etc. shown in FIG. 1. Moreover, the n+ type poly-silicon layer 700 shown in FIG. 3 corresponds to the output node 20 in FIG. 1.

In addition, the conductive layer 711 becomes a gate electrode of the element 100 or 101, and the gate electrode is formed so that its extension constitutes the word line 13 shown in FIG. 1. Therefore, as described above, coupling capacity of the storage nodes 30, 31 and the gate electrode 711, which becomes the word line 13, is kept as small as possible.

Device operation will be outlined as below.

Next, one specific application example, which uses the flip-flop according to the present invention, will be described. As regards the present invention, of course, it is needless to say that many application examples other than this example are applicable.

Figure 5:
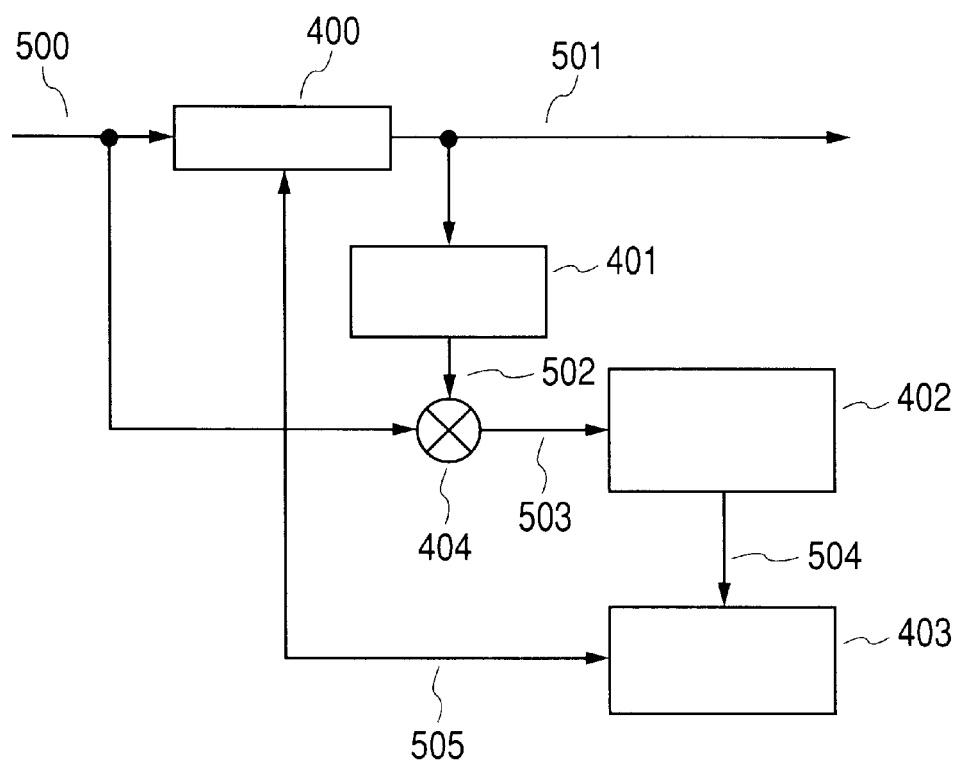
FIG. 5 is a circuit configuration diagram illustrating one application example that is suitable for a flip-flop circuit according to the present invention.

FIG. 5 show one application example that is suitable for a flip-flop according to the present invention. FIG. 4 is a block diagram illustrating an equalizing section that uses a FIR filter of a read channel LSI for a hard disk by means of a PRML method (Partial Response Maximum Likelihood). Because the equalizing section itself, which uses the FIR filter, is well-known, its configuration and operation will be described briefly.

An output 500 of an A/D converter is equalized by a FIR filter 400. Then, an output 501 of the FIR is supplied to a Viterbi decoder. An equalization characteristic of the FIR filter 400 is determined by a tap coefficient 505 of the filter. In general, this coefficient 505 is determined by means of learning typified by a LMS method. To be more specific, during a certain learning period, a control circuit 402 updates a value of a tap coefficient register 403 according to a equalization error 502 detected by an equalization error detecting circuit 401, and according to the output signal 500 of the A/D converter. Then, the tap coefficient 505 is determined so that the error satisfies a target value. Using this tap coefficient 505, equalization is performed at the time of practical use.

If the flip-flop according to the present invention is used for the tap coefficient register 403, the tap coefficient 505 can be stored even after the power supply is turned off. Therefore, even if it takes a long time for the learning, it is possible to use the tap coefficient, which has been determined as a result of the learning, immediately at the time of practical use. In addition, as regards the flip-flop according to the present invention, as opposed to the flash memory, there is no limit on the number of times writing is allowed. Therefore, the learning can be repeated many times. This permits the tap coefficient to be determined again in response to change with time caused by use of the device.

Figure 6:
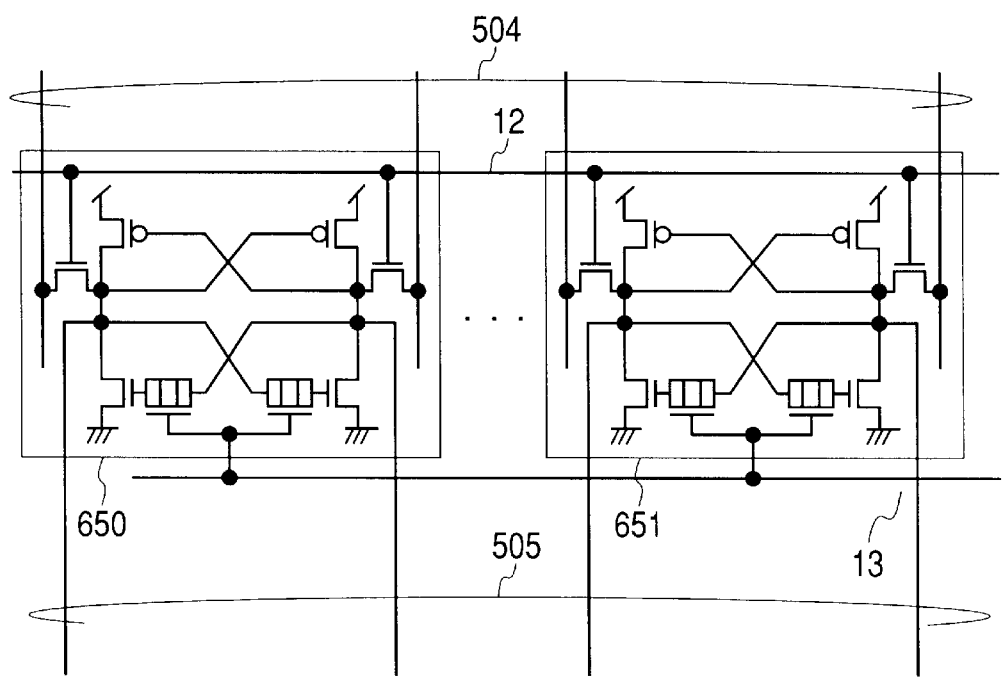
FIG. 6 is a configuration diagram of a tap coefficient register used in FIG. 5.

FIG. 6 shows an example of a tap coefficient register that uses the flip-flop according to the present invention (403).

In FIG. 6, memory cell circuits according to the present invention are shown as reference numerals 650, 651. In the tap coefficient register described above, such memory cell circuits are connected in a multistage form, for example, six stages. Reference numerals 12, 13 indicate corresponding word lines in FIG. 1; and reference numerals 504, 505 indicate signal lines corresponding to those shown in FIG. 5.

A updated value 504 of the tap coefficient shown in FIG. 5 is transferred to the memory cells 650, 651 as data to be written to the memory cells (10, 11 in FIG. 1). At the same time, a control circuit drives the word lines 12,13 to a "H" level, which causes the data to be stored in the memory cells. Because the updated value of the tap coefficient, which has been stored, is always output to output nodes (20, 21 in FIG. 1) of the memory cells, filter processing can be performed using this. That is to say, as shown in FIG. 6, a signal corresponding to 20, 21 shown in FIG. 1 is used as 505.

As described above, by using the register for tap coefficient and the memory cell according to the present invention, it is possible to provide a non-volatile register, for which there is no substantial limit of the number of times the non-volatile register can be rewritten. In this example, it is possible to realize a system that uses a learning algorithm requiring parameter rewriting for a long time and multiple times. The present invention can be applied not only to this example but also to a system that aims to operate in a similar manner.

Figure 7:
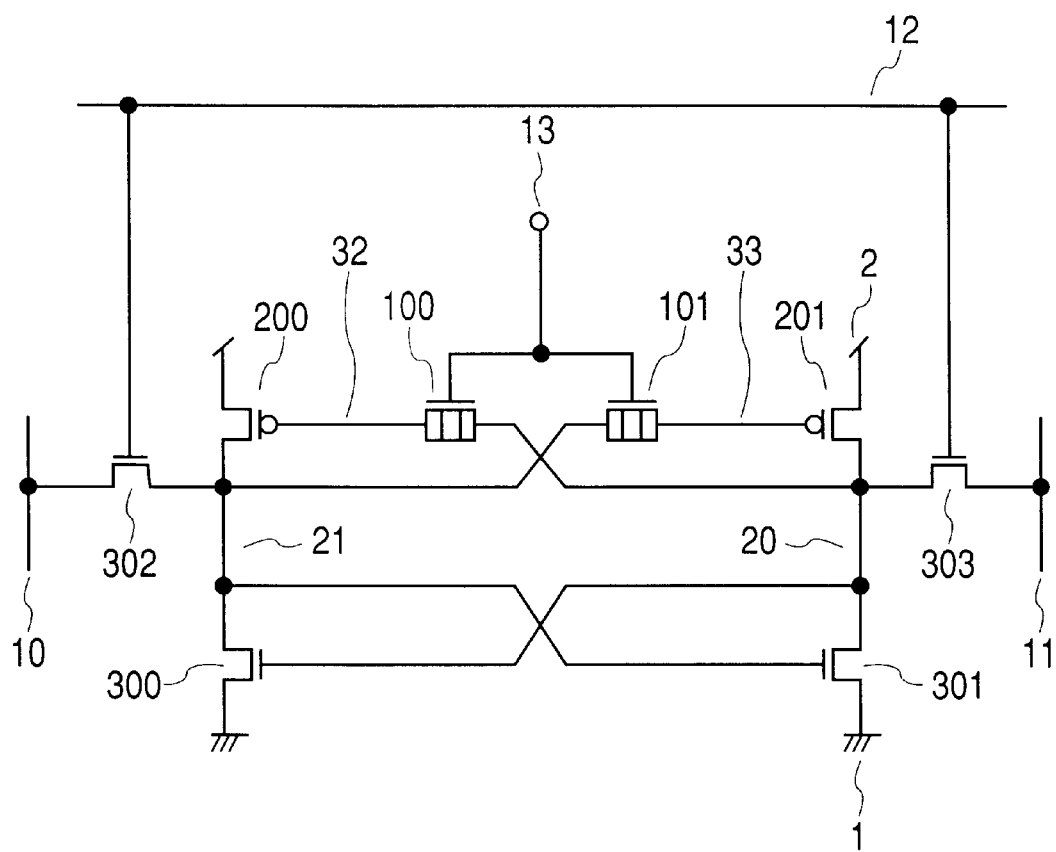
FIG. 7 is a circuit diagram illustrating another embodiment of a flip-flop circuit according to the present invention.
Figure 8:
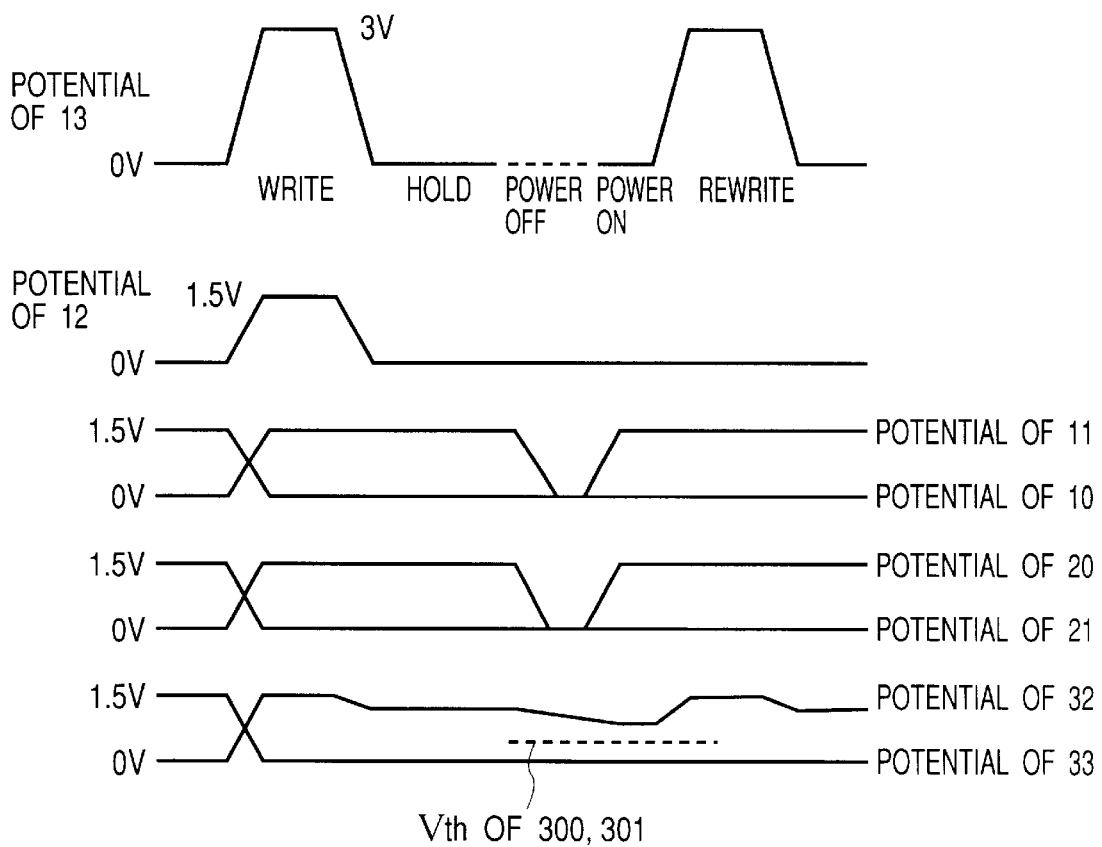
FIG. 8 is a time chart illustrating a part of an operation waveform of a circuit shown in FIG. 7.

FIG. 7 shows another example of the flip-flop according to the present invention. FIG. 1 illustrated the example in which the gate electrodes of the NMOSs 300, 301 are the storage nodes 30, 31. However, as shown in FIG. 7, it is also possible to use the gate electrodes of the PMOSs 200, 201 as storage nodes 32, 33. Except that an electric charge is stored in the reference numerals 32, 33, this circuit basically operates in a manner similar to the circuit shown in FIG. 1. Therefore, detailed description of the operation will be omitted. In this connection, FIG. 8 is a time chart illustrating a part of a operation waveform of the circuit shown in FIG. 7. Because FIG. 8 shows operation similar to that shown in FIG. 2, detailed description will be omitted.

Figure 9:
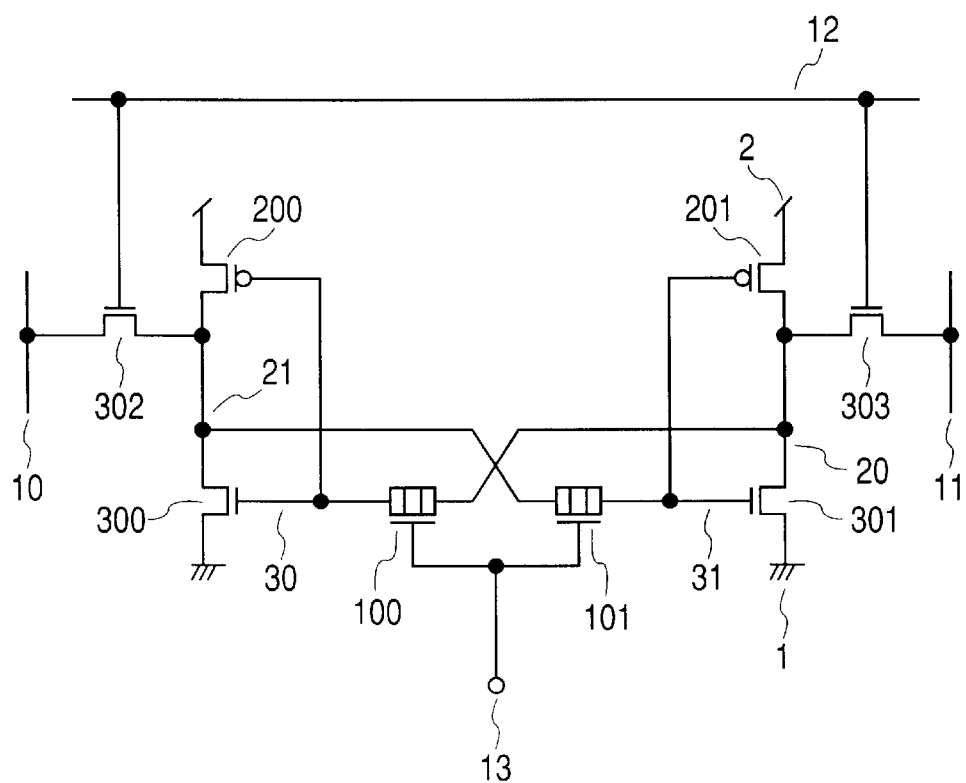
FIG. 9 is a circuit diagram illustrating another embodiment of a flip-flop circuit according to the present invention.
Figure 10:
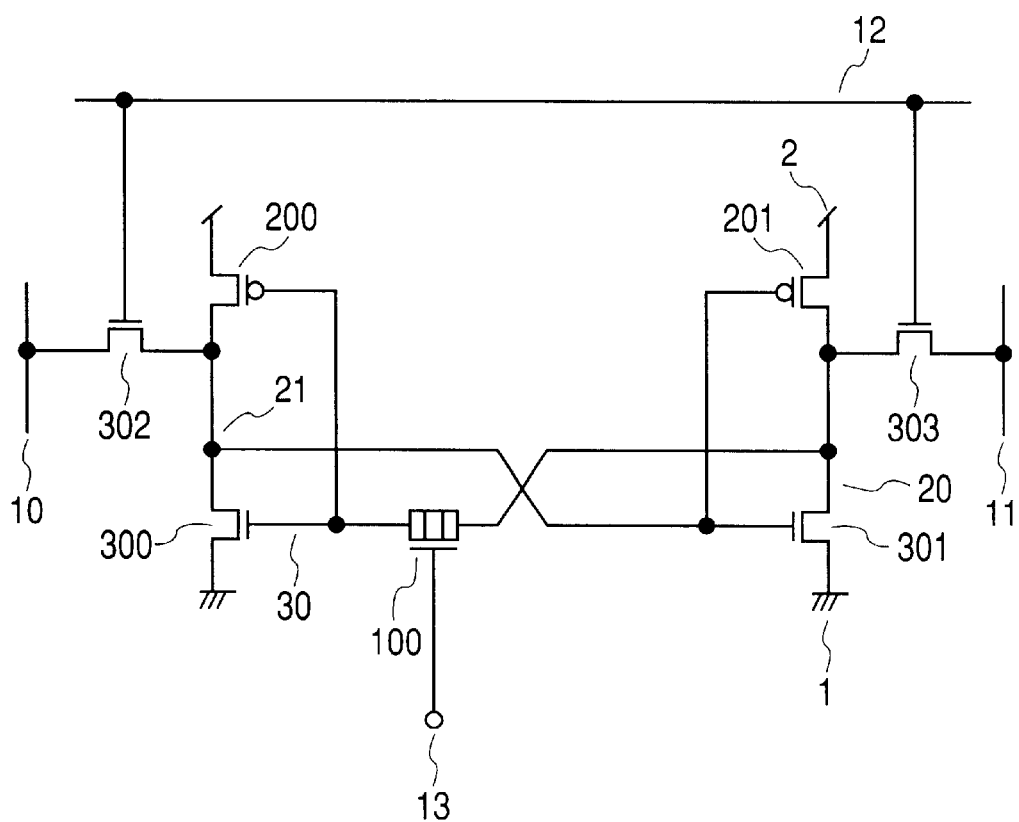
FIG. 10 is a circuit diagram illustrating another embodiment of a flip-flop circuit according to the present invention.

A circuit in FIG. 9 shows another example of the flip-flop according to the present invention. A circuit in FIG. 9 shows an example, in which the gate electrodes of the PMOSs 200, 201 are directly connected to the storage nodes 30, 31. The circuit in FIG. 9 also operates in a manner similar to the circuit shown in FIG. 1. Moreover, as shown in FIG. 10, even if either of the elements 100, 101, of which leak electric current is low, is omitted (for example, the element 101), the same operation as above can be performed, and the same effects as above are produced. In addition, in the example shown in FIG. 1 or 5, it is also possible to omit either of the elements 100, 101, of which leak electric current is low.

In the example shown in FIGS. 1 and 7, PLED elements are placed on both NMOS sides. However, it is also possible to divide two PLED elements into one NMOS and one PMOS for placement. For example, the element 100, of which leak electric current is low, can be placed on the NMOS side; and the element 101, of which leak electric current is low, can be placed on the PMOS side. Moreover, other than circuit configurations described above, various kinds of modified circuit configurations, which comply with the points of the present invention, can also be used. However, from the viewpoint of structure or production of the PLED element, it is desirable to laminate a barrier structure on the n+ type poly-silicon layer 701. Therefore, it is desirable to embody the circuit configurations taking this point into consideration.

INDUSTRIAL APPLICABILITY

As described above, the storage circuit according to the present invention provides a non-volatile storage circuit, which is capable of holding stored information even when the power supply is turned off. In addition, the storage circuit according to the present invention provides a non-volatile flip-flop circuit, which is capable of holding stored information even when the power supply is turned off. Moreover, the storage circuit according to the present invention provides a non-volatile SRAM (Static Random Access Memory), which is capable of holding stored information even when the power supply is turned off.

What is claimed is:

1. A storage circuit comprising a flip-flop, wherein: a memory element is a device comprising:
    a first path for a carrier;
    a first node for storing a charge that generates an electric field where conductivity of the first path is changed; and
    a barrier structure through which a second carrier moves in response to given voltage so that the second carrier is stored in the first node; and
    said flip-flop has at least a second node, to which information stored in the first node is output steadily in a state in which power is supplied to the memory element.

2. A storage circuit comprising a flip-flop, wherein:
    a first cross couple, which uses two N type gate insulated field effect transistors, and a second cross couple, which uses two P type gate insulated field effect transistors, are connected in parallel;
    a layered structure of an insulated layer and a semiconductor layer, which is coupled between a gate electrode of a drive gate insulated field effect transistor for either of the first cross couple or the second cross couple and a node outputting a voltage having the same phase as the gate electrode.

3. A storage circuit according to claim 2, wherein:
    said layered structure of insulated layer and semiconductor layer is coupled between the gate electrode of the N type gate insulated field effect transistor of the first cross couple, and said node.

4. A storage circuit according to claim 1, wherein:
    said flip-flop has a first cross couple, which uses two N type gate insulated field effect transistors, a second cross couple, which uses two P type gate insulated field effect transistors, are connected in parallel, and a device between a gate electrode of a drive gate insulated field effect transistor for either of the first cross couple or the second cross couple a node outputting a voltage having the same phase as the gate electrode, said device comprising:
    a first path for a carrier;
    a first node for storing a charge that generates an electric field where conductivity of the first path is changed; and
    a barrier structure through which a second carrier moves in response to given voltage so that the second carrier is stored in the first node.

5. A storage circuit according to claim 4, wherein:
    said drive gate insulated field effect transistor is said N type gate insulated field effect transistor, and a node outputting a voltage having the same phase as the gate electrode, said device comprising:
    a first path for a carrier;
    a first node for storing a charge that generates an electric field where conductivity of the first path is changed; and
    a barrier structure through which a second carrier moves in response to given voltage so that the second carrier is stored in the first node.

6. A storage circuit according to claim 1, further comprising:

a first cross couple, which uses two N type gate insulated field effect transistors, and a second cross couple, which uses two P type gate insulated field effect transistors, are connected in parallel so that a first impurity area of the N type gate insulated field effect transistor is connected to a second impurity area of the P type gate insulated field effect transistor, and so that a gate electrode of the N type gate insulated field effect transistor is connected to a gate electrode of the P type gate insulated field effect transistor; and a device between a gate electrode of a drive gate insulated field effect transistor for the first and the second cross couple and a node outputting a voltage having the same phase as the gate electrode, said device comprising;

a first path for a carrier;

a first node for storing a charge that generates an electric field where conductivity of the first path is changed; and a barrier structure through which a second carrier moves in response to given voltage so that the second carrier is stored in the first node.

7. A storage circuit according to claim 1, further comprising:

a first cross couple, which uses two N type gate insulated field effect transistors, and a second cross couple, which uses two P type gate insulated field effect transistors, are connected in parallel so that a first impurity area of the N type gate insulated field effect transistor is connected to a second impurity area of the P type gate insulated field effect transistor, and so that a gate electrode of the N type gate insulated field effect transistor is connected to a gate electrode of the P type gate insulated field effect transistor; and a low leak semiconductor element, between a gate electrode of a drive gate insulated field effect transistor for the first and the second cross couple and a node outputting a voltage having the same phase as the gate electrode.

8. A storage circuit according to claim 1, further comprising:

a first cross couple, which uses two N type gate insulated field effect transistors, and a second cross couple, which uses two P type gate insulated field effect transistors, are connected in parallel so that a first impurity area of the N type gate insulated field effect transistor is connected to a second impurity area of the P type gate insulated field effect transistor, and so that a gate electrode of the N type gate insulated field effect transistor is connected to a gate electrode of the P type gate insulated field effect transistor;

between a gate electrode of a drive gate insulated field effect transistor for the first and the second cross couple and a node for outputting a voltage in phase with the gate electrode, there is a layered structure of an insulated layer and a semiconductor layer; and the layered structure is placed between a first electrode and an electron storage node.

9. A storage circuit according to claim 1, further comprising:

a first cross couple, which uses two N type gate insulated field effect transistors, and a second cross couple, which uses two P type gate insulated field effect transistors, are connected in parallel so that a first impurity area of the N type gate insulated field effect transistor is connected to a second impurity area of the P type gate insulated field effect transistor, and so that a gate electrode of the N type gate insulated field effect transistor is connected to a gate electrode of the P type gate insulated field effect transistor; and said flip-flop has a semiconductor storage element, in which stored information is low leak, between a gate electrode of a drive gate insulated field effect transistor for the first and the second cross couple and a node for outputting a voltage in phase with the gate electrode.

10. A storage circuit according to claim 1, further comprising:

a first cross couple, which uses two N type gate insulated field effect transistors, and a second cross couple, which uses two P type gate insulated field effect transistors, are connected in parallel;

between a gate electrode of a drive gate insulated field effect transistor for either of the first cross couple or the second cross couple and a node for outputting a voltage in phase with the gate electrode, there is a layered structure of an insulated layer and a semiconductor layer;

the layered structure is placed between a first electrode and an electron storage node.

11. A static random access memory device comprising a memory cell that includes a flip-flop, wherein:

a first cross couple, which uses two N type gate insulated field effect transistors, and a second cross couple, which uses two P type gate insulated field effect transistors, are connected in parallel;

a layered structure of insulated layer and semiconductor layer, which is coupled between a gate electrode of a drive gate insulated field effect transistor for either of the first cross couple or the second cross couple and a node outputting a voltage having the same phase as the gate electrode.

12. A static random access memory device according to claim 11, said layered structure comprising:

a first path for a carrier;

a first node for storing a charge that generates an electric field where conductivity of the first path is changed; and a barrier structure through which a second carrier moves in response to given voltage so that the second carrier is stored in the first node.

13. A static random access memory device according to claim 12, wherein a first impurity area of the N type gate insulated field effect transistor is connected to a second impurity area of the P type gate insulated field effect transistor.

* * * * *